United States Patent
Sun

[11] Patent Number: 5,936,286
[45] Date of Patent: Aug. 10, 1999

[54] DIFFERENTIAL POLY-EDGE OXIDATION FOR STABLE SRAM CELLS

[75] Inventor: Shih-Wei Sun, Taipei, Taiwan

[73] Assignee: United Microelectronics Corp., Taiwan

[21] Appl. No.: 08/806,346

[22] Filed: Feb. 26, 1997

Related U.S. Application Data

[60] Provisional application No. 60/020,149, Jun. 20, 1996.

[51] Int. Cl.⁶ .......................... H01L 29/76; H01L 29/94; H01L 31/062; H01L 27/11
[52] U.S. Cl. .......................... 257/369; 257/344; 257/407; 257/408; 257/903; 257/904
[58] Field of Search ..................................... 257/369, 344, 257/407, 408, 903, 904; 437/52

[56] References Cited

U.S. PATENT DOCUMENTS 5,426,065  6/1995  Chan et al. ................................ 437/52
5,508,540  4/1996  Ikeda et al. .............................. 257/903

FOREIGN PATENT DOCUMENTS 62-30374  2/1987  Japan ..................................... 257/344

*Primary Examiner*—Steven H. Loke
*Attorney, Agent, or Firm*—Rabin & Champagne, P.C.

[57] ABSTRACT

An SRAM cell having improved stability includes pass transistors having gate electrodes which are shaped by oxidation so that the lower edges of the gate electrodes are raised away from the substrate surface. Because the gate electrodes of the load and pull-down transistors are masked during the oxidation process, the gate electrodes of the load and pull-down transistors have the conventional rectangular shape. The modified shape of the gate electrodes of the pass transistors decreases the current flowing through the pass transistors relative to that which flows through the pull-down transistors, reducing the likelihood that data can inadvertently be lost from the SRAM cell.

5 Claims, 2 Drawing Sheets

DIFFERENTIAL POLY-EDGE OXIDATION FOR STABLE SRAM CELLS

This application claims priority from provisional application Ser. No. 60/020,149, filed Jun. 20, 1996.

BACKGROUND OF THE INVENTION

1. Field of the Invention

The present invention relates to static random access memories (SRAMs) and, more particularly, to SRAMs which have improved stability.

2. Description of the Related Art

Reduced geometry integrated circuit designs are adopted to increase the density of devices within integrated circuits, thereby increasing performance and decreasing the costs of the integrated circuits. Modem integrated circuit memories, including DRAMs, SRAMs, ROMs, EEPROMS, etc., are prominent examples of the application of this strategy. The density of memory cells within integrated circuit memories continues to increase, accompanied by a corresponding drop in the cost per bit of storage within such devices. Increases in density are accomplished by forming smaller structures within devices and by reducing the separation between devices or between the structures that make up the devices. Often, these smaller design rules are accompanied by layout, design and architectural modifications which are either made possible by the reduced device sizes or are necessary to maintain performance when such smaller design rules are implemented. As an example, the reduced operating voltages used in many conventional integrated circuits are made possible by improvements in design, such as reduced gate oxide thicknesses and improved tolerance controls in lithographic processing. On the other hand, reduced design rules make reduced operating voltages essential to limit the effects of hot carriers generated in small size devices operating at higher, previously conventional operating voltages.

Making static random access memories (SRAMs) in accordance with smaller design rules, as well as using reduced internal operating voltages, can reduce the stability of SRAM cells. Reduced operating voltages and other design changes can reduce the voltage margins which ensure that an SRAM cell remains in a stable data state during a data read operation, increasing the likelihood that the read operation could render indeterminate or lose entirely the data stored in the SRAM cell. Typical SRAM designs include two or four MOS transistors coupled together in a latch configuration having two charge storage nodes for storing the charge states which correspond to the data. Data are read out of the conventional SRAM cell in a non-destructive manner by selectively coupling each charge storage node to a corresponding one of a pair of complementary bit lines. The selective coupling is accomplished by a pair of pass transistors, each pass transistor connected between one of the charge storage nodes and the corresponding one of the complementary bit lines. Word line signals are provided to the gates of the pass transistors to switch the pass transistors ON during data read operations. Charge flows through the ON pass transistors to or from the charge storage nodes, discharging one of the bit lines and charging the other of the bit lines. The voltage changes on the bit lines are sensed by a differential amplifier.

For the SRAM cell's latch to remain stable during such a data reading operation, at least one of the charge storage nodes within the SRAM must charge or discharge at a faster rate than charge flows from or to the corresponding bit line. In the past, this control has been maintained by making the channel of the pass transistor connected to the particular charge storage node narrower and/or longer than the channel of at least one of the SRAM pull-down transistors having a drain connected to the particular charge storage node. This geometry allows more current to flow through the at least one SRAM pull-down transistor than through the corresponding pass transistor; consequently, the charge storage node charges or discharges faster than the corresponding bit line discharges or charges.

This geometry has certain disadvantages and limitations, however. For example, making the channel of the pass transistor narrow and long makes data read and write operations slow. In addition, the relative geometries of the different cell and pass transistors place limitations on exactly how small a particular SRAM cell can be made.

SUMMARY OF THE PREFERRED EMBODIMENTS

It is therefore an object of the present invention to provide an SRAM having improved stability which is capable of operating at reduced operating voltages or is capable of construction using smaller design rules. Preferably, the gate electrodes of the pass transistors used for accessing an SRAM cell are formed different from the gate electrodes of the pull-down transistors. Thus, the pass transistors will typically have a lower transconductance than the pull-down transistors, providing an increased level of stability for the SRAM cell. A particularly preferred embodiment of a method aspect of this invention allows for the cross-section of the gates of pass transistors to be tailored in a manner that can improve cell stability.

One embodiment of the present invention provides an SRAM having a plurality of SRAM cells addressed by bit lines, with the SRAM cells comprising a high reference potential contact and a lower reference potential contact and a charge storage node. The cells include a pull-down transistor and a pass transistor. The pull-down transistor is connected to the charge storage node and the lower reference potential contact, the pull-down transistor having a source, drain and a pull-down transistor gate electrode. The pass transistor is connected to the charge storage node and a bit line, the pass transistor having a source, a drain and a pass transistor gate electrode. The cross sectional profile of the pass transistor gate electrode is different from the cross sectional profile of the pull-down transistor gate electrode. In particular embodiments, the edges of the pass transistor gate electrode are spaced from the substrate by a greater distance than the edges of the pull-down transistor gate electrode are spaced from the substrate and by a greater distance than the center of the pass transistor gate electrode is spaced from the substrate.

Another embodiment of the present SRAM has a plurality of SRAM cells addressed by bit lines, the SRAM cells comprising a high reference potential contact and a lower reference potential contact a charge storage node. A pull-down transistor is connected to the charge storage node and the lower reference potential contact, the pull-down transistor having a source, a drain, a pull-down transistor channel region having edges along the pull-down transistor source and drain, and a pull-down transistor gate electrode. A pass transistor is connected to the charge storage node and a bit line, the pass transistor having a source, a drain, a pass transistor channel region and a pass transistor gate electrode. The pass transistor gate electrode comprises means for applying a non-uniform pass transistor electric field to the pass transistor channel region, wherein the pass transistor electric field is lower adjacent the edges of the pass transistor channel region than the electric field applied to a central portion of the pass transistor channel region, and wherein a pull-down transistor electric field applied by the pass transistor gate electrode to the pull-down transistor channel region is higher throughout the pass transistor channel region than the pass transistor electric field adjacent the edges of the pass transistor channel region for equal potentials applied to the pass transistor gate electrode and the pull-down transistor gate electrode.

A different aspect of the invention provides a method of forming an SRAM. A substrate is provided having conductor lines formed above the substrate, a first conductor line formed above a channel region of a pull-down transistor and a second conductor line formed above a channel region of a pass transistor. The first conductor line is masked to protect the first conductor line from oxidation. The second conductor line is exposed to an oxidizing ambient while the first conductor line is masked to cause the first and second conductor lines to have different cross-sectional profile shapes.

DETAILED DESCRIPTION OF THE PREFERRED EMBODIMENTS

Preferred embodiments of the present invention improve the stability of SRAM cells by selectively tailoring the transconductance of the pass transistors of an SRAM cell to limit the current flow through the pass transistors without altering the geometry and layout of the SRAM transistors. Particularly preferred embodiments of this invention tailor the transconductance of the pass transistors by altering the profile of the gates of the pass transistors. For example, a differential oxidation process can be used to oxidize the gate of the pass transistor to produce a gate having lower edges raised above the substrate in such a manner as to reduce the current flow through the channel of the pass transistor. This oxidation process is differential in that the gates of at least some of the cell transistors are protected during the oxidation step so that the profile of the pass transistor gate electrodes are altered while the profiles of the gates of the protected cell transistors are not altered by the oxidation process.

Figure 1:
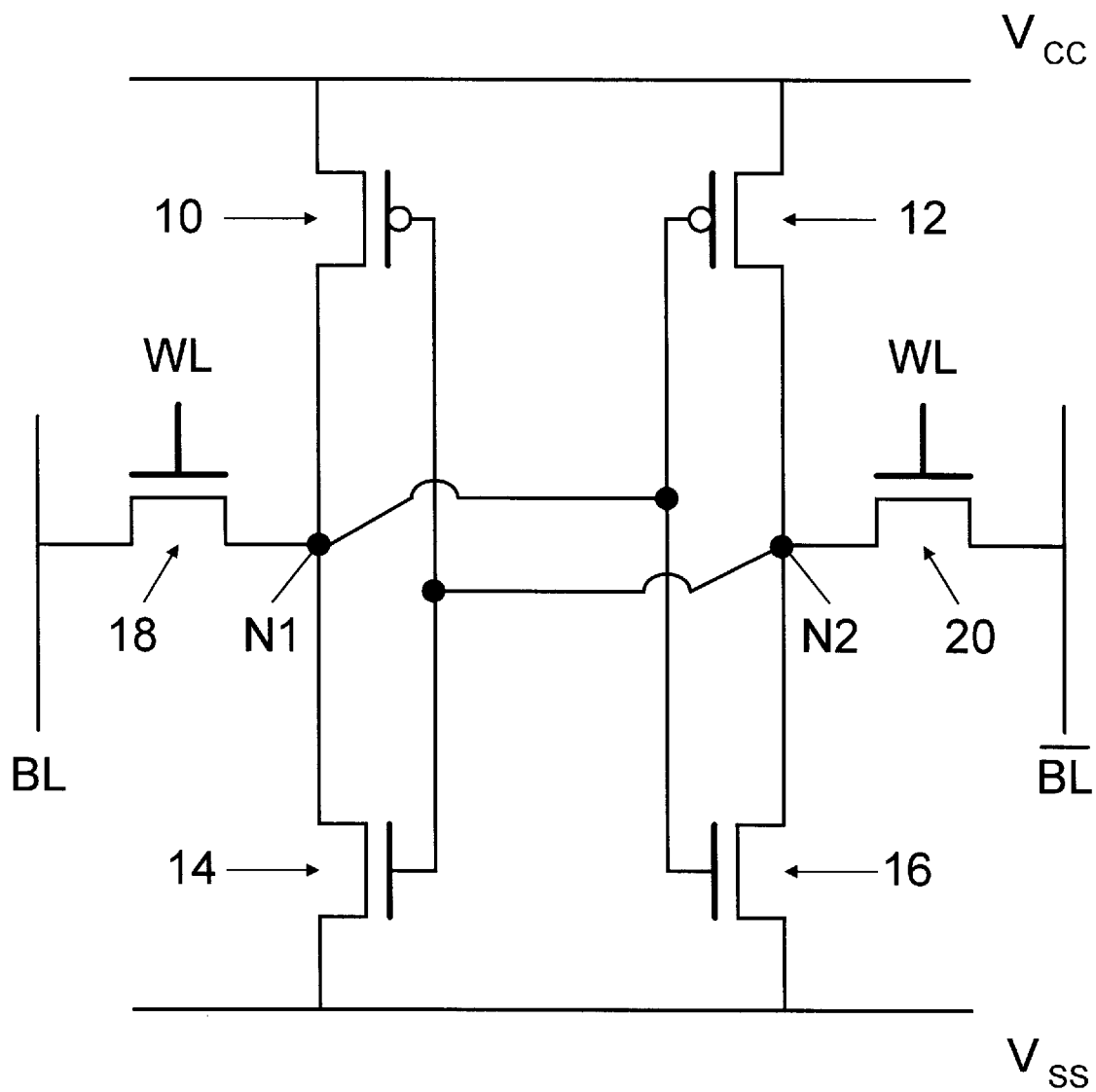
FIG. 1 is a circuit diagram of a particular embodiment of the present invention.

FIG. 1 illustrates an SRAM cell (a six transistor or 6T cell) including two PMOS load transistors 10, 12 and two NMOS pull-down transistors 14, 16 connected to form cross-coupled inverters. Each of the PMOS load transistors 10, 12 has its gate connected to the gate of a corresponding NMOS pull-down transistor 14, 16. The drains of the PMOS load transistors 10, 12 have their drains connected to the drains of corresponding NMOS transistors 14, 16 to form inverters having the conventional configuration. The sources of the load transistors are connected to a high reference potential, typically $V_{CC}$, and the sources of the pull-down transistors are connected to a lower reference potential, typically $V_{SS}$. The gates of PMOS transistor 10 and NMOS transistor 14 which make up one inverter are connected to the drains of transistors 12, 16 of the other inverter. Similarly, the gates of PMOS transistor 12 and NMOS transistor 16 which make up the other inverter are connected to the drains of transistors 10, 14. Hence, the potential present on the drains of transistors 10, 14 (node N1) of a first inverter is applied to the gates of transistors 12, 16, of a second inverter and the charge serves to keep the second inverter in an ON or OFF state. The logically opposite potential is present on the drains of transistors 12, 16 (node N2) of the second inverter and on the gates of transistors 10, 14 of the first inverter, keeping the first inverter in the complementary OFF or ON state. Thus, the latch of the illustrated SRAM cell has two stable states: one state with a predefined potential present on charge storage node N1 and a low potential on charge storage node N2 and a second state with a low potential on charge storage node N1 and the predefined potential on charge storage node N2. Binary data are recorded by toggling between the two states of the latch. Sufficient charge must be stored on the charge storage node, and thus on the coupled gates of associated inverter, to unambiguously hold one of the inverters "ON" and the other of the inverters "OFF", thereby preserving the memory state. The stability of an SRAM cell can be quantified by the margin by which the potential on the charge storage nodes can vary from its nominal value while still keeping the SRAM cell in its original state.

The state of the SRAM cell is conventionally read out by selectively connecting the two charge storage nodes N1, N2 of the cell to a pair of complementary bit lines (BL, $\overline{BL}$). A pair of pass transistors 18, 20 are connected between the charge storage nodes N1, N2 and the corresponding bit lines BL, $\overline{BL}$. Prior to a read out operation, the bit lines BL, $\overline{BL}$ are equalized at a voltage midway between the high and low reference voltages, typically $\frac{1}{2} \cdot (V_{CC} - V_{SS})$, and then a signal on the word line WL turns the pass transistors ON. As an example, consider that N1 is charged to a predetermined potential of $V_{CC}$ and N2 is charged to a lower potential $V_{SS}$. When the pass transistors 18, 20 turn ON, charge begins flowing from node N1 through pass transistor 18 to bit line BL. The charge on node N1 begins to drain off to the bit line BL and is replenished by charge flowing through load transistor 10 to node N1. At the same time, charge flows from bit line through pass transistor 20 to node N2 and the charge flows from the node N2 through the pull-down transistor 16. To the extent that more current flows through pass transistor 18 than flows through transistor 10, charge begins to drain from the node N1 which, on diminishing to a certain level, can begin turning OFF pull-down transistor 16. To the extent that more current flows through pass transistor 20 than flows through pull-down transistor 16, charge begins to accumulate on charge storage node N2 which, on charging to a certain level, can begin turning OFF load transistor 10.

The discharging and charging of the charge storage nodes N1, N2 can lead to the SRAM cell switching between memory states, thereby leaving erroneous data stored in the SRAM cell. It is thus desirable to control the amounts of current which can flow through the pass transistors to a relative level that is desirably below that which flows through at least some of the cell transistors, that is, a comparatively higher current should flow through one of the load or pull-down transistors connected to each of the charge storage nodes. Generally, six transistor SRAM cells use thin film transistors (TFTs) as the two load transistors 10 and 12. For such a two TFT SRAM cell configuration, the source, drain and channel regions as well as the gate electrodes of the load transistors 10, 12 are all formed from polysilicon deposited on a layer of insulating material that covers a lower layer of SRAM circuitry that includes the pass transistors and the pull-down transistors formed at the surface of the substrate. Although it would be possible to improve the stability of the SRAM cell by altering the transconductance through the TFT load transistors, it is generally more desirable to alter the relative characteristics of the pass transistor and the pull-down transistor when engineering SRAM cell stability. This is due, at least in part, to the greater consistency and reliability that can be obtained in defining the relative characteristics of transistors formed in the same "layer" of the SRAM.

In conventional SRAM applications, differences in the conductance through the pass transistors and the pull-down transistors have been introduced by providing pass transistors having relatively narrow and long channels and by providing pull-down transistors having relatively wide and shorter channels. In implementing smaller design rules or in designing for reduced operating voltages, however, it is undesirable to carry this strategy beyond its present implementation at this time because of the limitations imposed by processing, including minimum structure sizes. It is difficult to reduce the size of the cell further, while maintaining a constant ratio between the transconductance of the pull-down transistors and the pass transistors. Similarly, it is difficult to ensure sufficient voltage margins for cell stability if the operating voltage is reduced unless the cell size is made larger in an undesirable manner. Accordingly, embodiments of the present invention provide an alternative method for reducing the conduction through the pass transistors preferably without reducing the conduction through the pull-down transistor.

Figure 2:
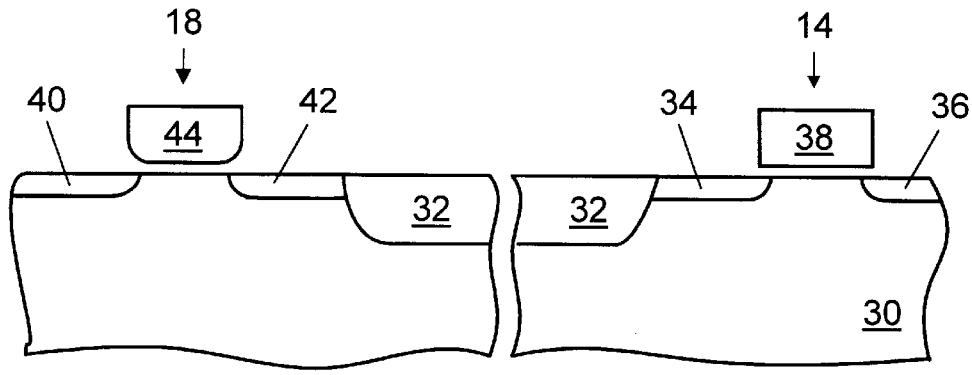
FIG. 2 is a schematic partial elevation view of a section of the SRAM illustrated in FIG. 1.

FIG. 2 illustrates in cross-section portions of an SRAM according to a preferred embodiment of the present invention, and more particularly, FIG. 2 schematically illustrates in profile a pull-down transistor 14 and a pass transistor 18 of a preferred SRAM embodiment. The illustrated embodiment includes a pass transistor gate electrode 44 that creates electric fields in the channel of the pass transistor that are significantly different from the electric fields created by a conventionally shaped pass transistor gate electrode. The electric field generated by the pass transistor gate electrode 44 is preferably most different from the electric field that would be generated by the gate electrode of the pull-down transistor within the channel region of the pass transistor and adjacent to the source and drain electrodes. Lower electric fields along the edges of the pass transistor gate electrode correspond to relatively fewer free carriers in these portions of the channel region, thereby decreasing the conductance through the pass transistor channel as compared to the case of the conventional pass transistor gate electrode. To emphasize the modification in the electric field generated within the channel region, it is particularly preferred that the lower edges of the pass transistor gate electrode be rounded to the extent that the rounding extends beyond the peripheral source/drain regions and over the channel region itself Thus, the lower edges of the pass transistor gate electrode will be lifted above the surface of the substrate over the channel region of the substrate, between the extent of the diffusion of the source/drain electrodes 40, 42.

Figure 4:
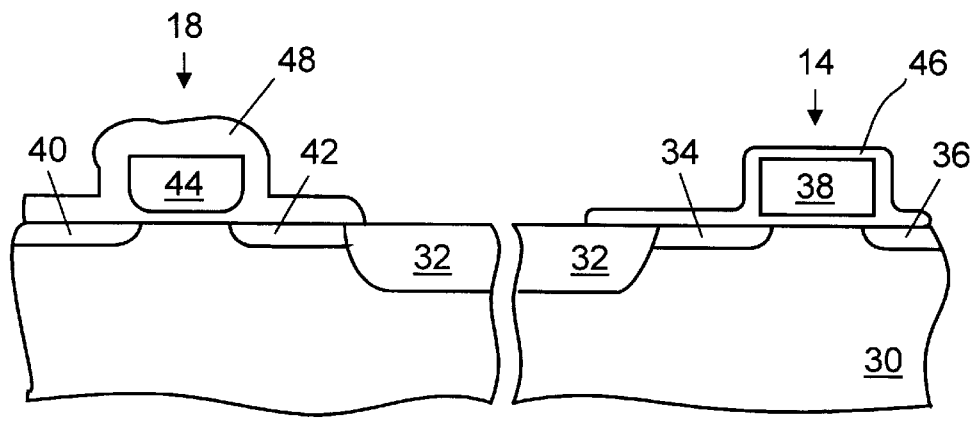

In this way, the lower edges of the pass transistor gate electrode are lifted away from the substrate over the region of the pass transistor to a great extent than the center of the lower surface of the pass transistor gate electrode. Thus as shown in FIGS. 2 and 4, a gap of varying width defined between the lower surface of pass transistor gate electrode and the substrate surface is greater at the edge portions of the lower surface than at the center portion, and is also greater than the width of a gap defined between the lower surface of the pull-down water gate electrode and the substrate surface, at the edge portions of such lower surface.

The conventional pass transistor gate electrode has a substantially planar lower surface separated from the channel region by a uniform distance. Of course, there will be some oxidation of the edges of the pass transistor gate electrode in the course of the conventional processing, but the conventional level of rounding will be significantly smaller than that achieved through practice of the present invention. For similar applied potentials over similar channel regions, the gate electrode 44 illustrated in FIG. 2 will apply lower electric fields to the edges of the channel regions causing the channel region to be less conductive than the channel of a pass transistor having a conventional planar gate electrode. Fewer free carriers will be present in the channel region of the pass transistor immediately adjacent the source/drain regions as compared to a comparable pass transistor having a conventional gate electrode. Additionally, for similar applied potentials, the gate of the pass transistor 44 will apply a lower electric field to the channel adjacent the source and drain regions 40, 42 than would be applied by the gate electrode 38 of the pull-down transistor. Accordingly, the different electric field generated by the illustrated pass transistor gate electrode reduces the transconductance through the channel of the pass transistor, reducing the amount of current flow through the pass transistor 18 relative to the current flow through the pull-down transistor 14. As is illustrated in FIG. 2, the cross-sectional profile of the gate electrode 38 of the pull-down transistor 14 is not significantly altered from the profile conventionally implemented in SRAMs, so that the tailoring of the cross-sectional profile of the gate electrode 44 of the pass transistor 18 reduces the conductance of the pass transistor 18 in a manner that will improve the stability of the SRAM cell.

The FIG. 2 SRAM is formed on a silicon substrate 30 and field oxide device isolation regions 32 are formed on the surface of the substrate 30. The pull-down transistor 14 consists of source/drain regions 34, 36 formed at the surface of the substrate 30 and a gate electrode 38 formed above a gate oxide layer on the surface of the substrate (not shown). Pass transistor 18 includes source/drain regions 40, 42 formed at the surface of the substrate and a gate electrode 44 formed on a gate oxide layer (not shown). The gate electrodes 38, 44 of the pull-down and pass transistors are formed at least partially from doped polysilicon. When the gate electrodes are formed as multiple layers of conductive material, at least the lowest portion of the gate electrodes is formed from a layer of doped polysilicon. The lowest layers of doped polysilicon within the gates of the pull-down and pass transistor electrodes 38, 44 may be formed from a single layer of polysilicon or, in other configurations of the SRAM cell, different polysilicon layers may be incorporated within the gate electrodes of the pull-down and pass transistors.

The structure illustrated in FIG. 2 can be obtained by a differential oxidation process in which the gate electrode of the pull-down transistors, and the load transistors if they are formed on the substrate level, are covered with a mask to protect the gate electrodes from oxidation. The gate electrodes of the pass transistors are left exposed or the mask over the pass transistors is removed to expose the gate electrodes of the pass transistors. The polysilicon gate electrode is then exposed to an oxidizing environment of, for example, oxygen at a temperature of approximately 800°1050° C. for a time period of sufficient duration to oxidize the lower edge of the gate electrode to the desired extent. Often, the upper edge of the pass transistor gate electrode will be oxidized at the same time during this process. However, if the pass transistor gate electrodes are formed of a multi-layer structure, such as when a layer of metal silicide is formed over the surface of the polysilicon electrode, it is possible that the upper surface of the pass transistor gate electrode will not be oxidized or will only be oxidized to a small extent. In such a case, the upper edge of the pass transistor gate electrode might retain a conventional shape, as is illustrated in the FIG. 2 embodiment. The gate electrode 38 of the pull-down transistor 14 has the typical, generally rectangular profile. Some rounding of the edges of the gate electrode 38 may occur during formation of different oxide layers around the gate electrode, but this rounding is minor and does not significantly alter the electric field distributions formed in the channel of the pull-down transistor. While the channels of the pull-down and pass transistors are shown as having approximately the same length between their respective source/drain regions, in many instances the channel of the pass transistor will be made to be longer than the channel of the pull-down transistor. After oxidation, an etch is performed to remove the polysilicon oxide, and then further processing is performed to complete the SRAM in a conventional manner.

The extent to which the transconductance of the pass transistor is reduced by the differential oxidation process depends on how much of the lower edge of the pass transistor gate electrode is removed. Accordingly, it will be necessary to determine the duration of the polysilicon oxidation process, and thus the extent to which the relative conduction of the pass transistor is reduced, by determining how much differentiation between the current flows between the pass transistors and the pull-down transistors is necessary to achieve a stable cell for a given transistor size and geometry, as well as other transistor and cell characteristics. Of course, reducing the amount of current that can flow through the pass transistor can impact other performance characteristics of the SRAM, such as access speed, so that it is undesirable to reduce the current capacity of the pass transistor to an overly large extent.

A similar effect to that obtained in the FIG. 2 embodiment might be obtained if the edges of the pass transistor gate electrode were formed from a material having a different work function with respect to silicon than the N-type polysilicon used for the central portion of the pass transistor gate electrode. For example, the edges of the pass transistor gate electrode might be formed from P-type polysilicon, which has a different work function with respect to silicon than does N-type polysilicon. In such an embodiment, a layer of tungsten silicide formed on the surface of the pass transistor gate electrode makes contact with both the N-type central portion and the P-type edge portions of the polysilicon gate electrode to maintain the entire gate electrode as an equipotential surface. The difference in work function at the edges of the pass transistor gate electrode would substantially alter the electric fields created within the channel and at the edges of the source/drain contact regions in a manner that would significantly alter the transconductance of the pass transistor. The width and doping of the P-type edge portions of the gate electrode can be varied to tailor the transconductance of the pass transistor to the desired level relative to that of the pull-down transistor. The FIG. 2 embodiment is preferred over such an alternative because the FIG. 2 embodiment can be manufactured with fewer processing steps and with more relaxed design rules.

Figure 3:
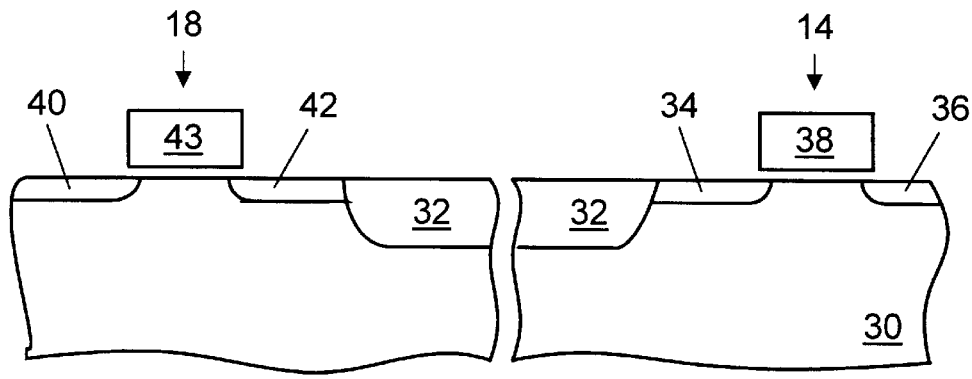
FIGS. 3 and 4 are partial elevation views in the process for making the device of FIG. 2.

FIGS. 3 and 4 illustrate some of the processing steps involved in the manufacture of an SRAM including cells having pass transistors tailored in the manner illustrated in FIG. 2. Because most of the SRAM structure and manufacturing is conventional, it is not discussed in detail here. Referring first to FIG. 3, the SRAM cell is shown in an intermediate stage of process. Field oxide device isolation regions 32 have been formed on the substrate 30, a layer of gate oxide (not shown) has been formed over the substrate 30, and a layer of doped polysilicon has been formed on the gate oxide layer. The doped polysilicon layer has been patterned in a preliminary fashion to provide a pull-down transistor gate electrode 38 having the conventional configuration and to provide an unshaped electrode 48 above the channel of the pass transistor 18. Source/drain implantations are made self-aligned to the gate electrodes 38, 43. If a lightly doped drain (LDD) source/drain configuration is to be used for these transistors, only the lightly doped drain portion of the implantation would typically be performed at this time.

Referring now to FIG. 4, after the gate electrodes are patterned as shown in FIG. 3, a mask 46 is formed over the gate electrode of the pull-down transistor to protect the polysilicon within the gate electrode. A number of different mask materials could be used to protect the pull-down transistor gate electrode. For example, a 50–500 Å thick layer of silicon oxide formed by chemical vapor deposition using a TEOS (tetra-ethyl-ortho-silicate) source or a high temperature oxide layer formed in a similar fashion. A protective mask formed from a layer of silicon nitride or a silicon oxynitride would provide better protection from further oxidation. After the mask 46 is formed, any oxide or mask material formed over the gate electrode of the pass transistor 18 is removed. This may be accomplished by forming a protective photoresist mask over at least the gate electrodes of the pull-down transistors and, when the load transistors are formed on the substrate level of the SRAM, over the load transistors as well. Any oxide layer is removed from the surface of the pass transistor gate electrode using a dilute HF solution or using an isotropic fluoride-based oxide dry etch. Other masking materials are removed as appropriate. The photoresist mask of the previous processing step will, of course, be ashed during any oxidation processing steps, so it may not be necessary to include a particular step to remove the photoresist mask. Next, a more prolonged oxidation process is performed to oxidize the polysilicon of the pass transistor gate electrode to the desired extent.

Further processing continues to complete the SRAM. If LDD source/drain regions are used for some or all of the SRAM transistors, the oxide or other masking layers over the appropriate gate electrodes are removed. Oxide spacers are formed on either side of the gate electrodes in the usual process of CVD oxide deposition and etch back, and then the heavily doped portions of the LDD electrodes are formed. If no further doping of the source/drain regions is necessary, then processing of the FIG. 4 structure continues with the deposition of a thicker insulating layer. In either case, further conventional processing is performed to complete the device.

While the present invention has been described in terms of certain preferred embodiments, those of ordinary skill will appreciate that various modifications and alterations to the embodiments described herein might be made without altering the basic function of the present invention. Accordingly, the scope of the present invention is not limited to the particular embodiments described herein; rather, the scope of the present invention is to be determined from the following claims.

What is claimed:

1. An SRAM having a plurality of SRAM cells addressed by bit lines, each of the SRAM cells comprising:

a high reference potential contact and a lower reference potential contact;

a charge storage node;

a pull-down transistor connected to the charge storage node and the lower reference potential contact, the pull-down transistor having a source, a drain, a pull-down transistor channel region having edges along the pull-down transistor source and drain, and a pull-down transistor gate electrode; and a pass transistor connected to the charge storage node and a bit line, the pass transistor having a source, a drain, a pass transistor channel region and a pass transistor gate electrode, the pass transistor gate electrode comprising means for applying a non-uniform pass transistor electric field to the pass transistor channel region, wherein the pass transistor electric field is lower adjacent the edges of the pass transistor channel region than the pass transistor electric field applied to a central portion of the pass transistor channel region, and wherein a pull-down transistor electric field applied by the pull-down pass transistor gate electrode to the pull-down transistor channel region is higher than the pass transistor electric field adjacent the edges of the pass transistor channel region for equal potentials applied to the pass transistor gate electrode and the pull-down transistor gate electrode.

2. The SRAM of claim 1, wherein the pass transistor gate electrode further includes:

a doped central portion located at the central portion of the pass transistor gate electrode; and a doped edge portion located at each of the edge portions of the pass transistor gate electrode.

3. The SRAM of claim 2, wherein the doped central portion includes N-type polysilicon, and the doped edge portion includes P-type polysilicon.

4. A SRAM having a plurality of SRAM cells addressed by bit lines, each of the SRAM cells comprising:

a high reference potential contact and a lower reference potential contact;

a charge storage node;

a substrate having a substrate surface;

a pull-down transistor on said substrate, connected to the charge storage node and the lower reference potential contact, the pull-down transistor having a source, a drain and a pull-down transistor gate electrode, the pull-down transistor gate electrode being spaced above the substrate surface so as to define a pull-down transistor gap between a lower surface of the pull-down transistor gate electrode and the substrate surface; and a pass transistor on said substrate, connected to the charge storage node and a bit line, the pass transistor having a source, a drain and a pass transistor gate electrode, the pass transistor gate electrode being spaced above the substrate surface so as to define a pass transistor gap between a lower surface of the pass transistor gate electrode and the substrate surface, the pass transistor gap having a varying width defined by a cross sectional profile of the pass transistor gate electrode which is different from a cross sectional profile of the pull-down transistor gate electrode, wherein the lower surface of the pass transistor gate electrode and the lower surface of the pull-down transistor gate electrode each includes opposite edge portions and a center portion between the edge portions, wherein the edge portions of the lower surface of the pass transistor gate electrode are shaped and disposed above the substrate surface so that the width of the pass transistor gap is greater at each of the edge portions of the lower surface of the pass transistor gate electrode than at the center portion of the lower surface of the pass transistor gate electrode, and wherein the width of the pass transistor gap at each of the edge portions of the lower edge of the pass transistor gate electrode is greater than the pass width of the pull-down transistor gap at each of the edge portions of the lower surface of the pull-down transistor gate electrode.

5. The SRAM of claim 1, wherein the lower edges of the pass transistor gate electrode are disposed above a surface of a substrate by a sufficient height to alter electric fields formed within a channel region of the pass transistor as compared to electric fields created by a pass transistor having a planar lower electrode by an amount sufficient to alter the transconductance of the pass transistor.

* * * * *